US012633504B2

(12) United States Patent
Yoo

(10) Patent No.: US 12,633,504 B2
(45) Date of Patent: May 19, 2026

(54) SUBSTRATE PROCESSING APPARATUS

(71) Applicant: PSK INC., Hwaseong-si (KR)

(72) Inventor: Kwang-Sung Yoo, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 493 days.

(21) Appl. No.: 18/026,911

(22) PCT Filed: Oct. 29, 2021

(86) PCT No.: PCT/KR2021/015419
§ 371 (c)(1),
(2) Date: Mar. 17, 2023

(87) PCT Pub. No.: WO2023/017908
PCT Pub. Date: Feb. 16, 2023

(65) Prior Publication Data
US 2023/0335381 A1      Oct. 19, 2023

(30) Foreign Application Priority Data

Aug. 10, 2021      (KR) ........................ 10-2021-0105563

(51) Int. Cl.
*H01J 37/32*      (2006.01)
(52) U.S. Cl.
CPC .... *H01J 37/32642* (2013.01); *H01J 37/3244* (2013.01); *H01J 2237/334* (2013.01)
(58) Field of Classification Search
USPC ...................................... 156/345.29, 345.24
See application file for complete search history.

(56) References Cited

U.S. PATENT DOCUMENTS

| | | | |
|---|---|---|---|
| 6,824,627 B2 | 11/2004 | Dhindsa et al. | |
| 7,615,131 B2 | 11/2009 | Lim | |
| 9,412,555 B2 | 8/2016 | Augustino et al. | |
| 2004/0238488 A1* | 12/2004 | Choi ................. | H01J 37/32009 |
| | | | 257/E21.252 |
| 2007/0029044 A1* | 2/2007 | Jeon ................. | H01J 37/32623 |
| | | | 156/345.44 |
| 2007/0068900 A1* | 3/2007 | Kim ................. | H01J 37/32532 |
| | | | 156/345.43 |
| 2007/0251919 A1* | 11/2007 | Imai ................. | H01J 37/32825 |
| | | | 156/345.35 |
| 2008/0227301 A1* | 9/2008 | Fang ................. | H01J 37/32642 |
| | | | 134/115 R |

(Continued)

FOREIGN PATENT DOCUMENTS

| | | |
|---|---|---|
| CN | 1723528 A | 1/2006 |
| KR | 10-0583418 B1 | 5/2006 |

(Continued)

*Primary Examiner* — Ram N Kackar
(74) *Attorney, Agent, or Firm* — Sughrue Mion, PLLC

(57) ABSTRACT

A substrate processing apparatus is provided. The substrate processing apparatus includes a chuck supporting a substrate, a gas supply unit configured to supply a process gas to an edge region of the substrate supported on the chuck, and an edge electrode provided to surround the substrate supported on the chuck when viewed from above and to generate plasma from the gas, wherein the edge electrode has a ring shape and a groove recessed in a direction from an inner periphery of the edge electrode to an outer periphery of the edge electrode when viewed from above is formed in the edge electrode.

16 Claims, 4 Drawing Sheets

(56)        References Cited

U.S. PATENT DOCUMENTS

| | | | | |
|---|---|---|---|---|
| 2009/0114244 A1* | 5/2009 | Sexton | ............. | H01J 37/32091 |
| | | | | 134/1.1 |
| 2010/0236717 A1 | 9/2010 | Chung et al. | | |
| 2012/0305189 A1 | 12/2012 | Kim et al. | | |
| 2015/0013906 A1* | 1/2015 | Fischer | ............. | H01J 37/32366 |
| | | | | 156/345.24 |
| 2019/0244788 A1 | 8/2019 | Marakhtanov et al. | | |
| 2019/0371581 A1* | 12/2019 | Wang | ............... | H01J 37/32926 |
| 2021/0043428 A1 | 2/2021 | Noorbakhsh et al. | | |
| 2021/0265138 A1* | 8/2021 | Ikeda | ............... | H01J 37/32568 |
| 2022/0059324 A1 | 2/2022 | Lee et al. | | |

FOREIGN PATENT DOCUMENTS

| | | | | | |
|---|---|---|---|---|---|
| KR | 10-2009-0000852 | * | 1/2009 | ........ | H01J 37/32385 |
| KR | 10-1346081 B1 | | 12/2013 | | |
| KR | 10-1412620 B1 | | 6/2014 | | |
| KR | 10-2275757 B1 | | 7/2021 | | |
| TW | 1496511 B | | 8/2015 | | |
| TW | 201816831 A | | 5/2018 | | |

* cited by examiner

SUBSTRATE PROCESSING APPARATUS

CROSS REFERENCE TO RELATED APPLICATIONS

This Application is a National Stage of International Application No. PCT/KR2021/015419 filed Oct. 29, 2021, claiming priority based on Korean Patent Application No. 10-2021-0105563 filed Aug. 10, 2021, the disclosures of which are incorporated herein by reference in their entireties.

TECHNICAL FIELD

The present disclosure relates to a substrate processing apparatus.

BACKGROUND ART

Plasma is an ionized gas state composed of ions, radicals, electrons, or the like and is generated in response to a very high temperature, a strong electric field, or a radio frequency (RF) electromagnetic field. A semiconductor device manufacturing process includes an ashing or etching process for removing a layer from a substrate by using plasma. The ashing or etching process is performed as ions and radical particles contained in plasma collide or react with a film material on a substrate. A process for processing a substrate by using plasma is performed in various methods. Among the methods, in a bevel etch method, plasma is transferred to an edge region of the substrate to remove a film material on the edge region of the substrate.

A typical bevel etch apparatus for performing a bevel etch process includes a chuck, an upper edge electrode, and a lower edge electrode. The chuck supports the substrate while the substrate is processed. The upper edge electrode and the lower edge electrode are arranged to face each other with an edge region of the substrate therebetween. At least one of the upper edge electrode and the lower edge electrode is provided to be movable in a vertical direction in order to reduce the gap between the upper edge electrode and the lower edge electrode while the substrate is loaded onto the chuck or is processed.

In a general bevel etch apparatus, a relative position or a relative angle between the upper edge electrode and the lower edge electrode may be shifted while the upper and lower edge electrodes are repeatedly moved. This may affect the flow of plasma delivered to the substrate and also results of repeated processing processes may not be uniform.

In addition, when installing the upper and lower edge electrodes, not only each of the upper and lower edge electrodes need to be accurately installed, but also the relative position and the relative angle between the upper edge electrode and the lower edge electrode need to be set up to a desired position and a desired angle, respectively, and thus, it takes a lot of time to set up and maintain the bevel etch apparatus.

In addition, both the upper edge electrode and the lower edge electrode may be grounded. However, because the upper edge electrode and the lower edge electrode have electrically different coupling positions, a potential difference may occur between the upper edge electrode and the lower edge electrode, which may impede controlling a region where the substrate is processed by the plasma.

DESCRIPTION OF EMBODIMENTS

Technical Problem

An object of the present disclosure is to provide a substrate processing apparatus capable of efficiently processing a substrate.

Another object of the present disclosure is to provide a substrate processing apparatus capable of providing uniform processing results for a substrate between repeated plasma processing processes.

Another object of the present disclosure is to provide a substrate processing apparatus capable of effectively reducing the time required for setup or maintenance.

Another object of the present disclosure is to provide a substrate processing apparatus capable of efficiently processing an edge region of a substrate by using one edge electrode.

The problem to be solved by the present disclosure is not limited to the above-mentioned problems, and problems not mentioned can be clearly understood by those of ordinary skill in the art to which the present disclosure belongs from the present specification and the accompanying drawings.

Solution to Problem

The present disclosure provides an apparatus for processing a substrate, that is, a substrate processing apparatus. The substrate processing apparatus includes a chuck supporting a substrate, a gas supply unit supplying a process gas to an edge region of the substrate supported on the chuck, and an edge electrode provided to surround the substrate supported on the chuck when viewed from above and to generate plasma from the gas, wherein the edge electrode has a ring shape and a groove recessed in a direction from an inner periphery of the edge electrode to an outer periphery of the edge electrode when viewed from above is formed in the edge electrode.

The groove may be formed at a position facing a side of the substrate while the substrate supported on the chuck is processed by the plasma.

The groove may be formed in a ring shape to surround a side of the substrate supported on the chuck.

The groove may be formed at a position spaced apart from an upper end or lower end of the edge electrode by a certain distance.

The substrate processing apparatus may further include a dielectric plate disposed to face an upper surface of the substrate supported on the chuck, and a base installed above the substrate supported on the chuck and fixing a position of the edge electrode.

The substrate processing apparatus may further include an insulating ring provided to surround the chuck, wherein the edge electrode may be provided to surround the insulating ring.

The edge electrode may be grounded.

The gas supply unit may include a first gas supply unit supplying an inert gas to a central region of the substrate supported on the chuck, and a second gas supply unit supplying the process gas to an edge region of the substrate supported on the chuck.

The substrate processing apparatus may further include a power member applying radio frequency (RF) power to the chuck.

The substrate processing apparatus may further include a dielectric plate provided to face an upper surface of the substrate supported on the chuck, and a gap measurement unit irradiating light for measuring a gap between the dielectric plate and the substrate supported on the chuck, wherein at least one of the dielectric plate and the chuck may be configured to be movable in a vertical direction, wherein an opening may be formed in the edge electrode such that the light irradiated by the gap measurement unit passes through the edge electrode to measure the gap.

The opening may be in communication with the groove, and at least two openings may be formed at positions facing each other to allow the light to pass therethrough.

In addition, the present disclosure provides an apparatus for processing a substrate, that is, a substrate processing apparatus. The substrate processing apparatus includes a housing having a processing space, a support unit supporting a substrate in the processing space, a dielectric plate disposed above the support unit and facing an upper surface of the substrate supported on the support unit, an upper edge electrode provided to surround the dielectric plate when viewed from above, a gas supply unit supplying a process gas to a space between the upper edge electrode and the dielectric plate, and a power member generating plasma from the process gas, wherein a groove recessed in a direction from an inner periphery of the upper edge electrode to an outer periphery of the upper edge electrode when viewed from above is formed in the upper edge electrode.

The groove may be formed at a position facing a side of the substrate supported on the support unit while the substrate is processed by the plasma.

The groove may be formed in a ring shape to surround a side of the substrate supported on the support unit.

The groove may be formed at a position spaced apart from an upper end or lower end of the upper edge electrode by a certain distance.

When viewed from a cross-section of the upper edge electrode, the upper edge electrode may have a 'ㄷ' shape due to the groove.

The housing may include a view port, and the substrate processing apparatus may further include a gap measurement unit measuring a gap between an upper surface of the substrate supported on the support unit and a lower surface of the dielectric plate by irradiating light into the processing space through the view port.

The gap measurement unit may include an irradiation unit irradiating the light, and a light receiving unit receiving the light irradiated by the irradiation unit, wherein an opening may be formed in the upper edge electrode such that the light irradiated by the irradiation unit is transmitted to the light receiving unit through the upper edge electrode.

The upper edge electrode may be installed such that the position thereof is fixed, wherein the support unit may include a chuck supporting the substrate, and a driving member vertically moving the chuck.

The support unit may further include a power member applying RF power to the chuck.

Advantageous Effects of Disclosure

According to an embodiment of the present disclosure, it is possible to efficiently process a substrate.

In addition, according to an embodiment of the present disclosure, a processing result for the substrate may be uniform between repeated plasma processing processes.

In addition, according to an embodiment of the present disclosure, it is possible to effectively reduce the time required for setup or maintenance.

In addition, according to an embodiment of the present disclosure, an edge region of the substrate may be efficiently processed using one edge electrode.

Effects of the present disclosure are not limited to the above-mentioned effects, and effects not mentioned can be clearly understood by those of ordinary skill in the art to which the present disclosure belongs from the present specification and the accompanying drawings.

MODE OF DISCLOSURE

Figure 1:
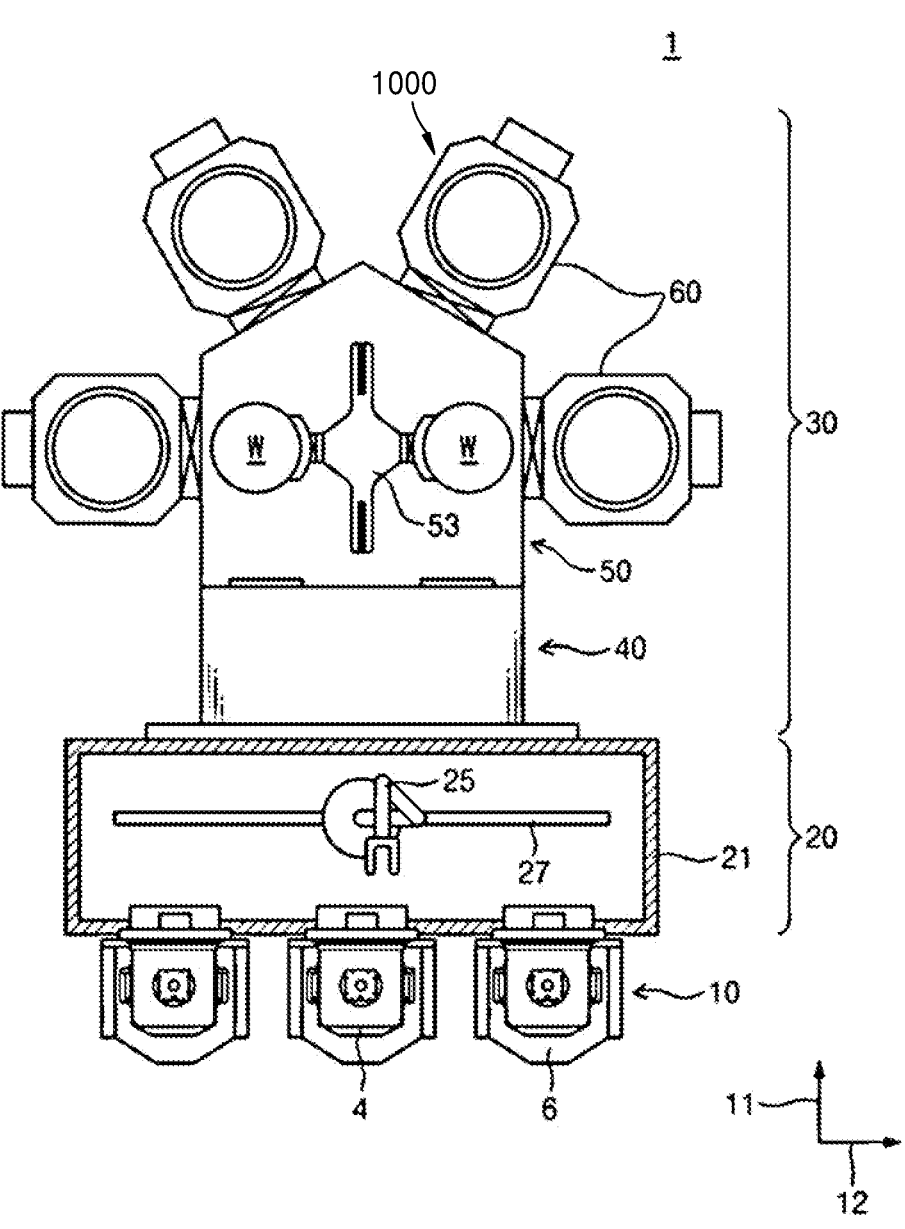
FIG. 1 is a view schematically illustrating substrate processing equipment according to an embodiment of the present disclosure.

Hereinafter, with reference to the accompanying drawings, embodiments of the present disclosure will be described in detail so that those of ordinary skill in the art may easily implement them. However, the present disclosure may be implemented in several different forms and is not limited to the embodiments described herein. In addition, in describing a preferred embodiment of the present disclosure in detail, if it is determined that a detailed description of a related known function or configuration may unnecessarily obscure the gist of the present disclosure, the detailed description thereof will be omitted. In addition, the same reference numerals are used throughout the drawings for parts having similar functions and operations.

When a portion "includes" an element, another element may be further included, rather than excluding the existence of the other element, unless otherwise described. Further, the terms such as "include", "comprise", or "have" in the present disclosure are used to specify the existence of features, numbers, processes, operations, components, parts recited in the detailed description, or combinations thereof, and thus should not be understood as pre-excluding the existence or possibility for addition of one or more other features, numbers, processes, operations, components, parts, or combinations thereof.

The singular expression includes plural expressions unless the context clearly implies otherwise. In the drawings, the size or thickness of each component may be exaggerated for clarity.

Hereinafter, an embodiment of the present disclosure will be described in detail with reference to FIGS. 1 to 4.

FIG. 1 is a view schematically illustrating a substrate processing equipment according to an embodiment of the present disclosure. Referring to FIG. 1, a substrate processing equipment 1 includes an equipment front-end module (EFEM) 20 and a processing module 30. The EFEM 20 and the processing module 30 are arranged in one direction.

The EFEM 20 has a load port 10 and a transfer frame 21. The load port 10 is disposed in front of the EFEM 20 in a first direction 11. The load port 10 has a plurality of support units 6. The support units 6 are arranged in a line in a second direction 12, and a carrier 4 (e.g., cassette or front opening unified pod (FOUP)) in which a substrate W to be provided
for a process and a substrate W on which the process is
completed are accommodated is seated on each of the
support units 6. The carrier 4 accommodates the substrate W
to be provided for the process and the substrate W on which
the process is completed. The transfer frame 21 is disposed
between the load port 10 and the processing module 30. The
transfer frame 21 includes a first transfer robot 25 disposed
therein and transferring the substrate W between the load
port 10 and the processing module 30. The first transfer
robot 25 moves along a transfer rail 27 provided in the
second direction 12 and transfers the substrate W between
the carrier 4 and the processing module 30.

The processing module 30 includes a load lock chamber
40, a transfer chamber 50, and a process chamber 60. The
processing module 30 may receive the substrate W from the
EFEM 20 and process the substrate W.

The load lock chamber 40 is disposed adjacent to the
transfer frame 21. For example, the load lock chamber 40
may be disposed between the transfer chamber 50 and the
EFEM 20. The load lock chamber 40 provides a space for
waiting before the substrate W to be provided for the process
is transferred to the process chamber 60, or before the
substrate W on which the process is completed is transferred
to the EFEM 20.

The transfer chamber 50 may transfer the substrate W.
The transfer chamber 50 is disposed adjacent to the load lock
chamber 40. The transfer chamber 50 has a polygonal body
when viewed from above. Referring to FIG. 1, the transfer
chamber 50 has a pentagonal body when viewed from
above. A load lock chamber 40 and a plurality of process
chambers 60 are disposed on the outside of the body along
the circumference of the body. A passage (not shown)
through which the substrate W enters and exits is formed on
each sidewall of the body, and the passage connects the
transfer chamber 50 to the load lock chamber 40 or the
process chambers 60. Each passage is provided with a door
(not shown) that opens and closes the passage to seal the
inside. A second transfer robot 53 for transferring the
substrate W between the load lock chamber 40 and the
process chambers 60 is disposed in an internal space of the
transfer chamber 50. The second transfer robot 53 transfers
an unprocessed substrate W waiting in the load lock cham-
ber 40 to the process chamber 60, or transfers a processed
substrate W to the load lock chamber 40. In addition, the
second transfer robot 53 may load the substrate W into a
processing space 102 of a housing 100 to be described
below, or may unload the substrate W from the processing
space 102. In addition, the second transfer robot 53 may
transfer substrates W between the process chambers 60 in
order to sequentially provide the substrates W to the plural-
ity of process chambers 60. As shown in FIG. 1, when the
transfer chamber 50 has a pentagonal body, the load lock
chamber 40 is disposed on a side wall of the transfer
chamber 50 adjacent to the EFEM 20, and the process
chambers 60 are sequentially disposed on the remaining
sidewalls of the transfer chamber 50. The transfer chamber
50 may be provided in various forms depending on a
required process module as well as the above shape.

The process chamber 60 may be disposed adjacent to the
transfer chamber 50. The process chamber 60 is disposed
along the circumference of the transfer chamber 50. A
plurality of process chambers 60 may be provided. In each
of the process chambers 60, a process for the substrate W
may be performed. The process chamber 60 receives a
substrate W from the second transfer robot 53 to process the
substrate W, and provides a processed substrate W to the second transfer robot 53. Processes performed in the process
chambers 60, respectively may be different from each other.

Hereinafter, a substrate processing apparatus 1000 per-
forming a plasma process in the process chamber 60 is
described. In addition, the case in which the substrate
processing apparatus 1000 is configured to perform a plasma
processing process on an edge region of a substrate in the
process chamber 60 is described below as an example.
However, the present disclosure is not limited thereto, and
the substrate processing apparatus 1000 described below
may be equally or similarly applied to various chambers in
which substrate processing is performed. Also, the substrate
processing apparatus 1000 may be equally or similarly
applied to various chambers in which a plasma processing
process for a substrate is performed.

Figure 2:
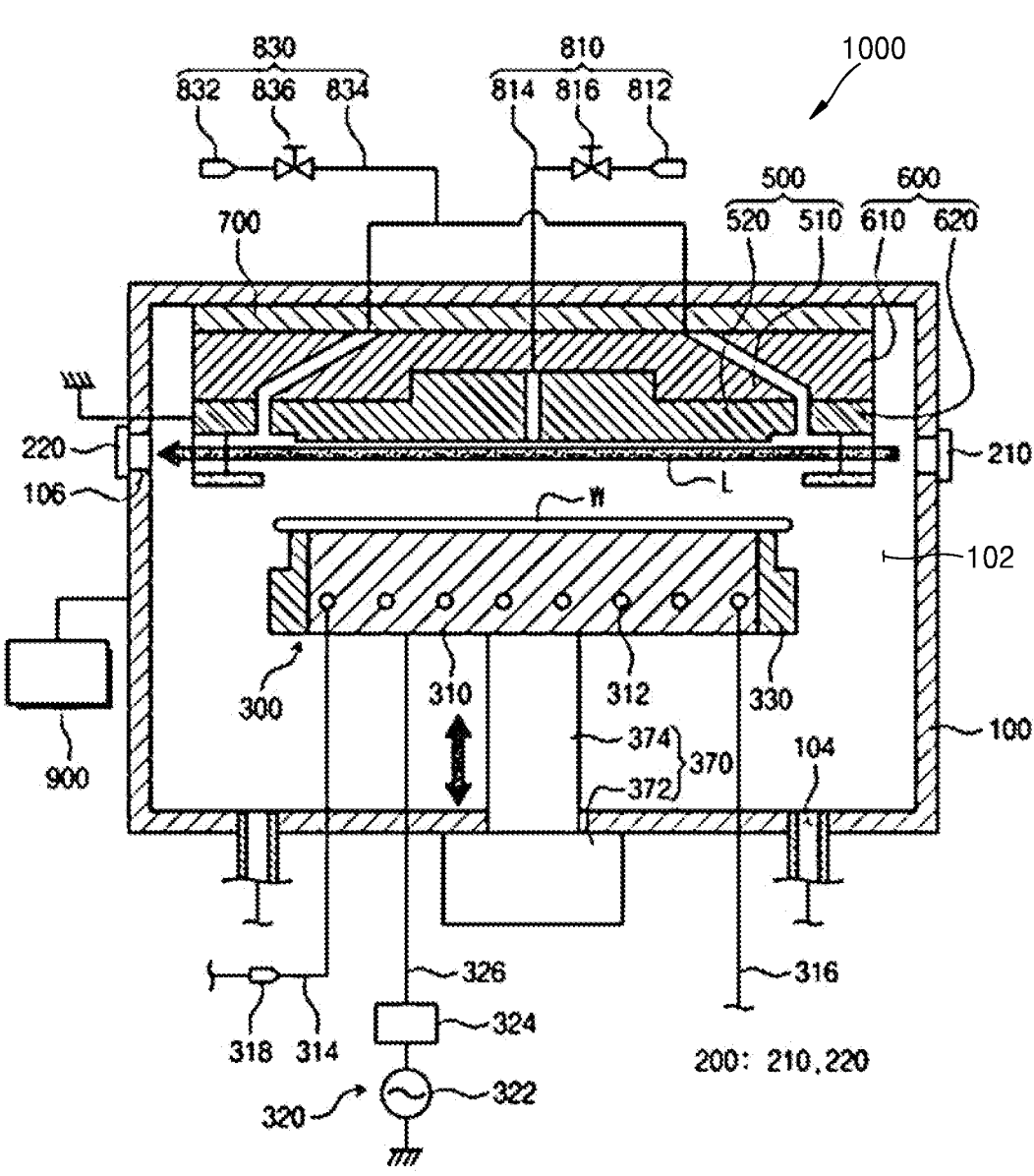
FIG. 2 is a view illustrating an embodiment of a substrate processing apparatus provided in a process chamber of FIG. 1.

FIG. 2 is a view illustrating an embodiment of a substrate
processing apparatus provided in the process chamber 60 of
FIG. 1. Referring to FIG. 2, the substrate processing appa-
ratus 1000 provided in the process chamber 60 performs a
predetermined process on a substrate W by using plasma.
For example, the substrate processing apparatus 1000 may
etch or ash a film material on the substrate W. The film
material may be of various types, such as a polysilicon film,
a silicon oxide filmI, and a silicon nitride film. In addition,
the film material may be a natural oxide film or a chemically
generated oxide film. In addition, the film material may be
a by-product generated in the process of processing the
substrate W. In addition, the film material may be impurities
attached and/or remaining on the substrate W.

The substrate processing apparatus 1000 may perform a
plasma process on the substrate W. For example, the sub-
strate processing apparatus 1000 may process the substrate
W by supplying a process gas and generating plasma from
the supplied process gas. The substrate processing apparatus
1000 may process an edge region of the substrate W by
supplying a process gas and generating plasma from the
supplied process gas. Hereinafter, the substrate processing
apparatus 1000 is described as an example of a bevel etch
apparatus performing an etching process on the edge region
of the substrate W.

The substrate processing apparatus 1000 may include a
housing 100, a gap measurement unit 200, a support unit
300, a dielectric plate unit 500, an upper electrode unit 600,
a temperature control plate 700, a gas supply unit 800, and
a controller 900.

The housing 100 may have a processing space 102
therein. An opening (not shown) may be formed in one
surface of the housing 100. The substrate W may be brought
into or taken out of the processing space 102 of the housing
100 through the opening formed in the housing 100. The
opening may be opened and closed by an opening and
closing member, such as a door (not shown). When the
opening of the housing 100 is closed by the opening and
closing member, the processing space 102 of the housing
100 may be isolated from the outside. In addition, the
atmosphere of the processing space 102 of the housing 100
may be adjusted to a low pressure close to vacuum after the
processing space 102 of the housing 100 is isolated from the
outside. In addition, the housing 100 may include a material
including a metal. Also, the surface of the housing 100 may
be coated with an insulating material. Also, the housing 100
may be grounded.

Also, the housing 100 may be a vacuum chamber. For
example, an exhaust hole 104 may be formed in the bottom
surface of the housing 100. Plasma P generated in the
processing space 212 or gases G1 and G2 supplied to the
processing space 212 may be exhausted to the outside through an exhaust hole 104. In addition, by-products generated in the process of processing the substrate W by using the plasma P may be exhausted to the outside through the exhaust hole 104. The exhaust hole 104 may be connected to an exhaust line (not shown). The exhaust line may be connected with a pressure reducing member providing pressure reduction. The pressure reducing member may provide pressure reduction to the processing space 102 through the exhaust line.

The housing 100 may include a view port 106. The view port 106 may be a port that is made of a transparent material so that an operator may visually check the processing space 102 of the housing 100, or a port through which light L irradiated by an irradiation unit 210 to be described below may pass. The view port 106 may be provided on a sidewall of the housing 100. A pair of view ports 106 may be provided to face each other.

The gap measurement unit 200 may measure a gap between the dielectric plate 520 and the substrate W. Also, the gap measurement unit 200 may measure a gap between the dielectric plate 520 and the chuck 310. For example, the gap measurement unit 200 may measure a gap between the lower surface of the dielectric plate 520 and the upper surface of the substrate W supported on the chuck 310. Also, the gap measurement unit 200 may measure a gap between the lower surface of the dielectric plate 520 and the upper surface of the chuck 310.

The gap measurement unit 200 may be a gap sensor. For example, the gap measurement unit 200 may be a gap sensor that measures a gap by using light of a light-emitting diode (LED) or laser having straightness.

The gap measurement unit 200 may include an irradiation unit 210 and a light receiving unit 220. The irradiation unit 210 may irradiate light L. The light receiving unit 220 may receive the light L emitted by the irradiation unit 210. The light receiving unit 220 may be disposed on a traveling path of the light L irradiated by the irradiation unit 210. In addition, the irradiation unit 210 and the light receiving unit 220 may be installed in the view port 106 described above. For example, the irradiation unit 210 may be installed in any one of the pair of view ports 106, and the light receiving unit 220 may be installed in the other one of the pair of view ports 106. In other words, the light L which is irradiated by the irradiation unit 210 to the processing space 102 through any one of the pair of view ports 106 may be transmitted through the other one of the pair of view ports 106 to the light receiving unit 220. The irradiation unit 210 and the light receiving unit 220 may be disposed to face each other with the view ports 106 therebetween. The light receiving unit 220 may sense the light L irradiated by the irradiation unit 210 and measure a gap between the substrate W and the dielectric plate 520. For example, a portion of the light L emitted by the irradiation unit 210 may be blocked by the substrate W supported on the chuck 310, and another portion of the light L may be transmitted to the light receiving unit 220. The light receiving unit 220 may measure a gap between the substrate W and the dielectric plate 520 based on the amount of light L received and/or the position at which the light L is received. In addition, when the substrate W is not supported on the chuck 310, a gap between the upper surface of the chuck 310 and the lower surface of the dielectric plate 520 may be measured in a similar manner to the above.

The support unit 300 may support the substrate W in the processing space 102. The support unit 300 may include a chuck 310, a power member 320, an insulating ring 330, and a driving member 370.

The chuck 310 may support the substrate W in the processing space 102. The chuck 310 may have a support surface for supporting the substrate W. The chuck 310 may have a circular shape when viewed from above. The chuck 310 may have a smaller diameter than the substrate W when viewed from above. Accordingly, a central region of the substrate W supported on the chuck 310 may be seated on the support surface of the chuck 310, and an edge region of the substrate W may not contact the support surface of the chuck 310.

A heating means (not shown) may be provided inside the chuck 310. The heating means (not shown) may heat the chuck 310. The heating means may be a heater. Also, a cooling passage 312 may be formed in the chuck 310. The cooling passage 312 may be formed inside the chuck 310. A cooling fluid supply line 314 and a cooling fluid discharge line 316 may be connected to the cooling passage 312. The cooling fluid supply line 314 may be connected to a cooling fluid supply source 318. The cooling fluid supply source 318 may store a cooling fluid and/or supply the cooling fluid to the cooling fluid supply line 314. Also, the cooling fluid supplied to the cooling passage 312 may be discharged to the outside through the cooling fluid discharge line 316. The cooling fluid stored in and/or supplied by the cooling fluid supply source 318 may be cooling water or cooling gas. In addition, the shape of the cooling passage 312 formed in the chuck 310 is not limited to the shape shown in FIG. 3 and may be variously modified. In addition, a configuration for cooling the chuck 310 is not limited to a configuration for supplying a cooling fluid, and various configurations (e.g., a cooling plate) capable of cooling the chuck 310 may be provided.

The power member 320 may supply radio frequency (RF) power to the chuck 310. The power member 320 may include a power source 322, a matcher 324, and a power line 326. The power source 322 may be a bias power source. Also, the power source 332 may be an RF power source. The power source 322 may be connected to the chuck 310 via the power line 326. Also, the matcher 324 may be provided to the power line 326 to perform impedance matching.

The insulating ring 330 may be provided to have a ring shape when viewed from above. The insulating ring 330 may be provided to surround the chuck 310 when viewed from above. For example, the insulating ring 330 may have a ring shape. The insulating ring 330 may include an insulating material.

The driving member 370 may elevate the chuck 310. The driving member 370 may include an actuator 372 and a shaft 374. The shaft 374 may be coupled with the chuck 310. The shaft 374 may be coupled with the actuator 372. The actuator 372 may raise and lower the chuck 310 in a vertical direction via the shaft 374. As the driving member 370 elevates the chuck 310, the gap between the upper surface of the substrate W supported on the chuck 310 and the lower surface of the dielectric plate 520 may be adjusted.

The dielectric plate unit 500 may include a dielectric plate 520 and a first base 510. Also, the dielectric plate unit 500 may be coupled to a temperature control plate 700 to be described below.

The dielectric plate 520 may be disposed so that the lower surface thereof faces the upper surface of the chuck 310. The dielectric plate 520 may have a circular shape when viewed from above. In addition, the upper surface of the dielectric plate 520 may be stepped so that the height of a central region of the upper surface is greater than the height of an edge region thereof. In addition, the lower surface of the dielectric plate 520 may have a flat shape. Also, an edge region of the lower surface of the dielectric plate 520 may be stepped to have a height greater than that of a central region of the lower surface of the dielectric plate 520. Plasma P to be described below may enter a stepped region of the lower surface of the dielectric plate 520 to thereby increase processing efficiency for the edge region of the substrate W.

The dielectric plate 520 may be disposed to face the upper surface of the substrate W supported on the support unit 300, specifically, the chuck 310, in the processing space 102. The dielectric plate 520 may be disposed above the support unit 300. The dielectric plate 520 may be made of a material including ceramic. A gas flow path connected to a first gas supply unit 810 of a gas supply unit 800 to be described below may be formed in the dielectric plate 520. In addition, a discharge end of the gas flow path may be configured such that a first gas G1 supplied by the first gas supply unit 810 is supplied to a central region of the substrate W supported on the support unit 300. In addition, the discharge end of the gas flow path may be configured such that the first gas G1 is supplied to the upper surface of the central region of the substrate W supported on the support unit 300.

The first base 510 may be disposed between the dielectric plate 520 and the temperature control plate 700 to be described below. The first base 510 may be coupled to the temperature control plate 700 to be described below, and the dielectric plate 520 may be coupled to the first base 510. Accordingly, the dielectric plate 520 may be coupled to the temperature control plate 700 via the first base 510.

The diameter of the first base 510 may gradually increase from the top to the bottom. The upper surface of the first base 510 may have a smaller diameter than the lower surface of the dielectric plate 520. The upper surface of the first base 510 may have a flat shape. In addition, the lower surface of the first base 510 may have a stepped shape. For example, the lower surface of an edge region of the first base 510 may be stepped to have a height less than that of the lower surface of a central region of the first base 510. In addition, the lower surface of the first base 510 and the upper surface of the dielectric plate 520 may have shapes that may be combined with each other. For example, the central region of the dielectric plate 520 may be inserted into the central region of the first base 510. Also, the first base 510 may be made of a material including a metal. For example, the first base 510 may be made of a material including aluminum. The position of the dielectric plate 520 may be fixed by the first base 510.

The upper electrode unit 600 may include a second base 610 and an upper edge electrode 620. In addition, the upper electrode unit 600 may be coupled to the temperature control plate 700 to be described below. The upper edge electrode 620 may be grounded. The upper edge electrode 620 may have a shape surrounding the dielectric plate 520 when viewed from above. The upper edge electrode 620 may be provided to be spaced apart from the dielectric plate 520. The upper edge electrode 620 may be spaced apart from the dielectric plate 520 to form a separation space. The separation space may form a part of a gas channel through which a second gas G2 supplied by a second gas supply unit 830 to be described below flows. A discharge end of the gas channel may be configured such that the second gas G2 is supplied to an edge region of the substrate W supported on the support unit 300. In addition, the discharge end of the gas channel may be configured such that the second gas G2 is supplied to the upper surface of the edge region of the substrate W supported on the support unit 300.

A groove 622 and an opening 624 may be formed in the upper edge electrode 620. The groove 622 and the opening 624 formed in the upper edge electrode 620 are described below.

The second base 610 may be installed above the chuck 310 and the substrate W supported on the chuck 310. The second base 610 may fix the position of the upper edge electrode 620. The second base 610 may be disposed between the upper edge electrode 620 and the temperature control plate 700 to be described below. The second base 610 may be coupled to the temperature control plate 700 to be described below, and the upper edge electrode 620 may be coupled to the second base 610. Accordingly, the upper edge electrode 620 may be coupled to the temperature control plate 700 via the second base 610.

The second base 610 may have a ring shape when viewed from above. The upper and lower surfaces of the second base 610 may have flat shapes. When viewed from above, the second base 610 may have a shape surrounding the first base 510. The inner diameter of the second base 610 may gradually increase from the top to the bottom. The second base 610 may be provided to be spaced apart from the first base 510. The second base 610 may be spaced apart from the first base 510 to form a separation space. The separation space may form a part of a gas channel through which the second gas G2 supplied by the second gas supply unit 830 to be described below flows. Also, the second base 610 may be made of a material including a metal. For example, the second base 610 may include a material including aluminum.

The temperature control plate 700 may be coupled to the dielectric plate unit 500 and the upper electrode unit 600. The temperature control plate 700 may be installed in the housing 100. The temperature control plate 700 may generate heat. For example, the temperature control plate 700 may generate hot or cold heat. The temperature control plate 700 may receive a signal from a controller 900 to be described below and generate heat. The temperature control plate 700 may generate hot or cold heat and control the dielectric plate unit 500 and the upper electrode unit 600 to maintain relatively constant temperatures. For example, the temperature control plate 700 may generate cold heat and may prevent the temperatures of the dielectric plate unit 500 and the upper electrode unit 600 as much as possible from excessively increasing in the process of processing the substrate W.

According to an embodiment of the present disclosure, the first base 510 is disposed between the dielectric plate 520 and the temperature control plate 700. The first base 510 may be made of a material different from that of the dielectric plate 520 and may be made of the same material as the temperature control plate 700. In other words, the coefficient of thermal expansion of the first base 510 may be closer to the coefficient of thermal expansion of the temperature control plate 700 than that of the dielectric plate 520. In other words, as the first base 510 is disposed between the dielectric plate 520 and the temperature control plate 700, the occurrence of distortion between the temperature control plate 700 and the dielectric plate 520 due to cold heat and the like generated by the temperature control plate 700 may be minimized. This is because the first base 510 in direct contact with the temperature control plate 700 is made of a material similar to that of the temperature control plate 700.

Similarly, according to an embodiment of the present disclosure, the second base 610 is disposed between the upper edge electrode 620 and the temperature control plate 700. The second base 610 may be made of a material different from that of the upper edge electrode 620 and may be made of the same material as the temperature control plate 700. In other words, the coefficient of thermal expansion of the second base 610 may be closer to the coefficient of thermal expansion of the temperature control plate 700 than that of the upper edge electrode 620. In other words, as the second base 610 is disposed between the upper edge electrode 620 and the temperature control plate 700, the occurrence of distortion between the temperature control plate 700 and the upper edge electrode 620 due to cold heat and the like generated by the temperature control plate 700 may be minimized. This is because the second base 610 in direct contact with the temperature control plate 700 is made of a material similar to that of the temperature control plate 700.

The gas supply unit 800 may supply gas to the processing space 102. The gas supply unit 800 may supply the first gas G1 and the second gas G2 to the processing space 102. The gas supply unit 800 may include a first gas supply unit 810 and a second gas supply unit 830.

The first gas supply unit 810 may supply the first gas G1 to the processing space 102. The first gas G1 may be an inert gas, such as nitrogen. The first gas supply unit 810 may supply the first gas G1 to the central region of the substrate W supported on the chuck 310. The first gas supply unit 810 may include a first gas supply source 812, a first gas supply line 814, and a first valve 816. The first gas supply source 812 may store the first gas G1 and/or supply the first gas G1 to the first gas supply line 814. The first gas supply line 814 may be connected to a flow path formed in the dielectric plate 520. The first valve 816 may be installed in the first gas supply line 814. The first valve 816 may be an on/off valve or may be provided as a flow control valve. The first gas G1 supplied by the first gas supply source 812 may be supplied to a central region of the upper surface of the substrate W through the flow path formed in the dielectric plate 520.

The second gas supply unit 830 may supply the second gas G2 to the processing space 102. The second gas G2 may be a process gas excited into a plasma state. The second gas supply unit 830 may supply the second gas G2 to the edge region of the substrate W through a gas channel formed as the dielectric plate 520, the first base 510, the upper edge electrode 620, and the second base 610, which are provided on the edge region of the substrate W supported on the chuck 310, are spaced apart from each other. The second gas supply unit 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to a separation space that functions as a gas channel. The second valve 836 may be installed in the second gas supply line 834. The second valve 836 may be an on/off valve or may be provided as a flow control valve. The second gas G2 supplied by the second gas source 832 may be supplied to an edge region of the upper surface of the substrate W through a second flow path 602.

The controller 900 may control the substrate processing apparatus 1000. The controller 900 may control the substrate processing apparatus 1000 to perform a plasma processing process to be performed below. For example, the controller 900 may control the gas supply unit 800, the temperature control plate 700, and the support unit 300. For example, when gas is supplied from the first gas supply unit 810 and/or the second gas supply unit 830, the controller 900 may control the support unit 300 and the gas supply unit 800 so that the power source 322 applies power to the chuck 310 and the plasma P is generated in the edge region of the substrate W supported on the chuck 310.

The controller 900 may control the substrate processing apparatus 1000 to perform a substrate processing method described below. In addition, the controller 900 may include a process controller, a user interface, and a storage unit. The process controller may include a microprocessor (computer) that executes control of the substrate processing apparatus 1000. The user interface may include a keyboard through which an operator performs command input operations and the like to manage the substrate processing apparatus 1000, and/or a display that visualizes and displays the operation status of the substrate processing apparatus 1000. The storage unit may store a control program for executing, under the control of the process controller, processing that is executed in the substrate processing apparatus 1000, and/or a program (i.e., a processing recipe) for executing processing in each component unit according to various types of data and processing conditions. Furthermore, the user interface and the storage unit may be connected to the process controller. The processing recipe may be stored in a storage medium of the storage unit, and the storage medium may be a hard disk, a portable disk, such as a CD-ROM or DVD, or a semiconductor memory, such as a flash memory.

Figure 3:
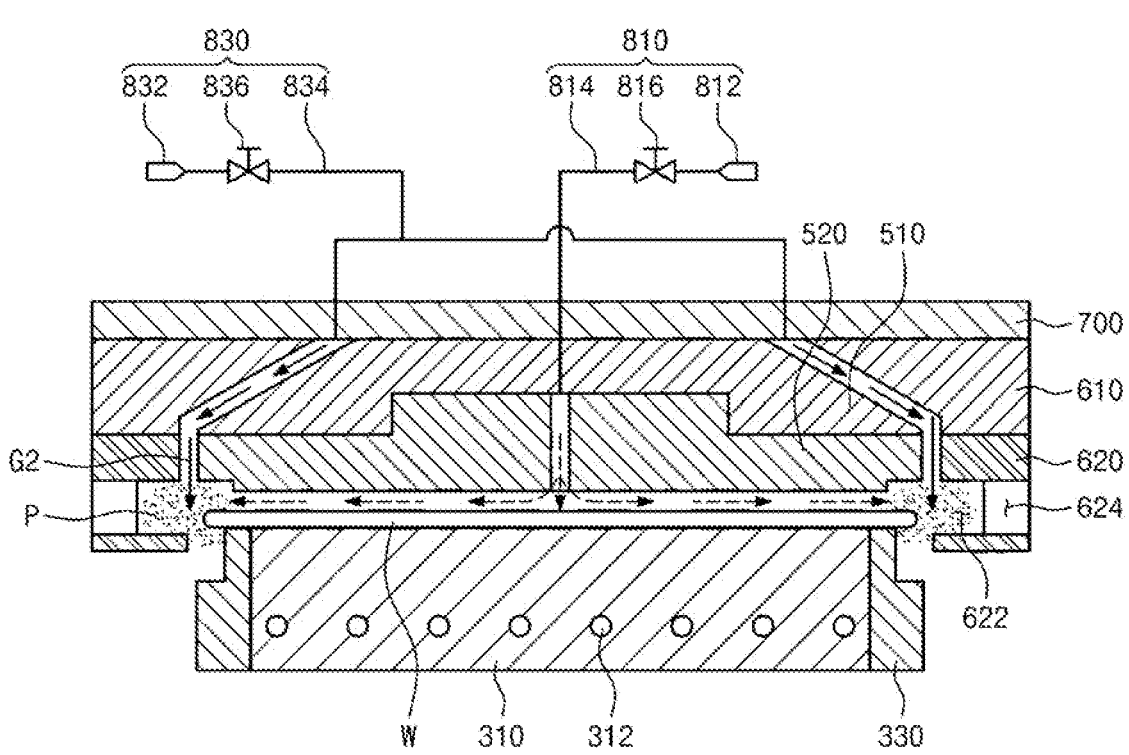
FIG. 3 is a view illustrating an embodiment in which the substrate processing apparatus of FIG. 2 performs a plasma processing process.

FIG. 3 is a view illustrating an embodiment in which the substrate processing apparatus 1000 of FIG. 2 performs a plasma processing process. Referring to FIG. 3, the substrate processing apparatus 1000 according to an embodiment of the present disclosure may process an edge region of a substrate W. For example, the substrate processing apparatus 1000 may generate plasma P in the edge region of the substrate W to process the edge region of the substrate W. For example, the substrate processing apparatus 1000 may perform a bevel etch process for processing the edge region of the substrate W.

In order to perform the bevel etch process on the substrate W, the driving member 370 may move the chuck 310 upward to narrow a gap between the substrate W and the dielectric plate 520.

When the substrate processing apparatus 1000 processes the edge region of the substrate W, the first gas supply unit 810 may supply the first gas G1 to the central region of the substrate W, and the second gas supply unit 830 may supply the second gas G2 to the edge region of the substrate W. Because the second gas G2 supplied from the second gas supply unit 830 is a process gas, the second gas G2 may be excited into a plasma P to thereby process the edge region of the substrate W. For example, a thin film on the edge region of the substrate W may be etched by the plasma P. In addition, the first gas G1 supplied to the central region of the substrate W is an inert gas, and the first gas G1 may prevent the second gas G2 from flowing into the central region of the substrate W and thus the processing efficiency of the edge region of the substrate W may be further increased. In addition, the temperature control plate 700 may generate cold heat to suppress an excessive increase in the temperatures of the dielectric plate unit 500 and the upper electrode unit 600 while the substrate W is processed.

A groove 622 may be formed in the upper edge electrode 620. The groove 622 may have a shape that is recessed in a direction from the inner periphery of the upper edge electrode 620 to the outer periphery of the upper edge electrode 620 when viewed from above. The groove 622 may be formed at a position spaced apart from the upper end and lower end of the upper edge electrode 620 by a predetermined distance. The groove 622 may be formed in the upper edge electrode 620, and thus, the cross-section of the upper edge electrode 620 may have a substantially '⊏' shape. A space formed by the groove 622 may function as a shielding space for confining the plasma P in a certain region so that the processing of the substrate W by the plasma P may be efficiently performed.

Also, the groove 622 may be formed at a position facing the side of the substrate W while the substrate W is processed by the plasma P. Also, the groove 622 may be formed in a ring shape to surround the side of the substrate W supported on the chuck 310. Because the groove 622 has a substantially '⊏' shape and a shielding space for confining the plasma P in a certain region is formed by the groove 622, both the functions of upper and lower edge electrodes of the existing bevel etch apparatus may be performed with only one upper edge electrode 620. In addition, the upper edge electrode 620 is installed in the second base 610 having a fixed position. In other words, because the upper edge electrode 620 does not have a configuration in which the position thereof is changed, even when a process of processing the substrate W is repeatedly performed, the problem that the position of the upper edge electrode 620 is misaligned may be solved. In addition, according to an embodiment of the present disclosure, because a lower edge electrode facing the upper edge electrode 620 is not required, a problem caused by the deviation of the relative positions and relative angles of the conventional upper and lower edge electrodes may be solved. In addition, even during setup or maintenance of the substrate processing apparatus 1000, only the installation of the upper edge electrode 620 is required, and thus, the work time required for setup and maintenance may be effectively reduced.

In addition, at least one opening 624 may be formed in the upper edge electrode 620. The opening 624 may be formed so that light L irradiated by the gap measurement unit 200 may pass therethrough. The opening 624 may communicate with the groove 622. A plurality of openings 624 may be formed. For example, two openings 624 may be formed, and one of the two openings 624 may face the irradiation unit 210 and the other of the two openings 624 may face the light receiving unit 220. Accordingly, the light L irradiated by the gap measurement unit 200 may pass through the openings 624 formed in the upper edge electrode 620 and be transmitted to the light receiving unit 220. The size of the openings 624 may correspond to an area through which the light L may pass.

Conventionally, the reason why an edge electrode is divided into upper and lower edge electrodes is because it is impossible to measure the gap between the substrate W and the dielectric plate 520 when only one edge electrode is disposed. However, according to an embodiment of the present disclosure, by forming at least two openings 624, through which the light L irradiated by the gap measurement unit 200 may pass, in the upper edge electrode 620, the gap between the substrate W and the dielectric plate 520 may be measured even when only one upper edge electrode 620 is disposed.

Figure 4:
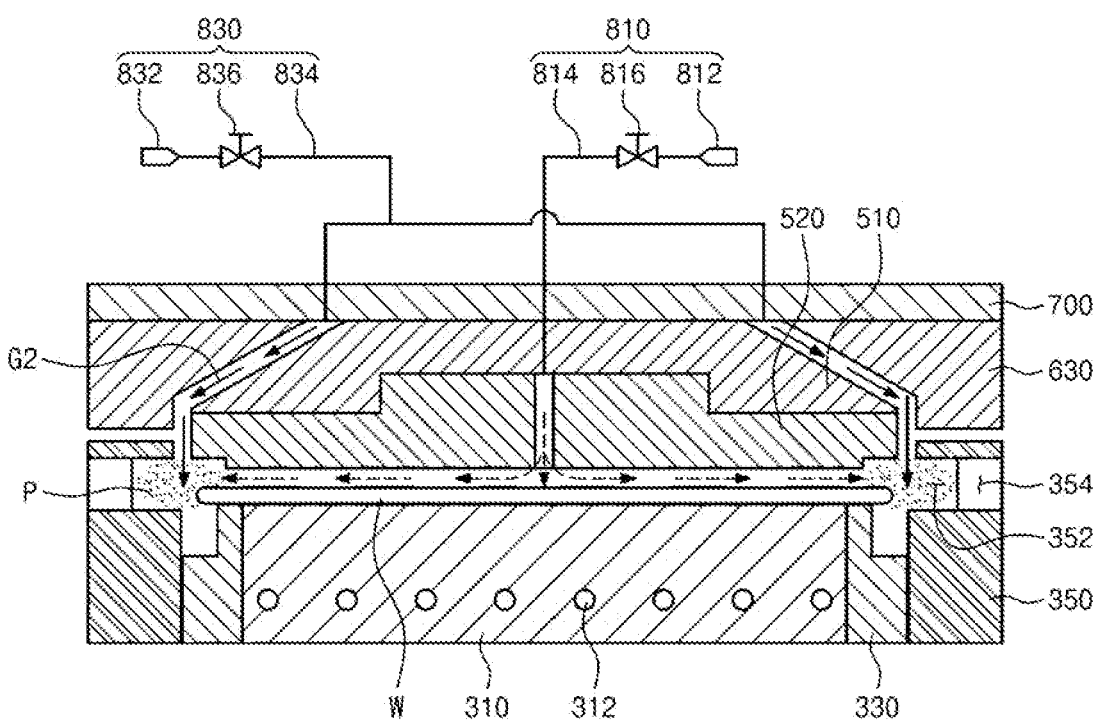
FIG. 4 is a view illustrating another embodiment of a substrate processing apparatus provided in the process chamber of FIG. 1.

FIG. 4 is a view illustrating another embodiment of a substrate processing apparatus provided in the process chamber of FIG. 1. In the above-described example, it has been described that the edge electrode provided in the substrate processing apparatus 1000 is the upper edge electrode 620 installed in the second base 610. However, the present disclosure is not limited thereto. For example, the edge electrode provided in the substrate processing apparatus 1000 may be a ring-shaped lower edge electrode 350 provided to surround the insulating ring 330 of the support unit 300. A groove 352 and an opening 354 may be formed in the lower edge electrode 350, the groove 352 and the opening 354 performing functions that are the same as or similar to those of the groove 622 and the opening 624 of the upper edge electrode 620. Also, instead of the second base 610 made of a metal material, an insulating base 630 made of an insulating material may be installed in the temperature control plate 700. The lower edge electrode 350 may be grounded.

In the above-described example, it has been described that the chuck 310 moves in the vertical direction and the positions of the dielectric plate 520 and the upper edge electrode 620 are fixed. However, the present disclosure is not limited thereto. For example, the position of the chuck 310 may be fixed and the dielectric plate 520 may be configured to be movable in the vertical direction. In addition, both the chuck 310 and the dielectric plate 520 may be configured to be movable in the vertical direction.

In addition, in the above-described example, it has been described that the upper edge electrode 620 and the lower edge electrode 350 are grounded. However, the present disclosure is not limited thereto. For example, the upper edge electrode 620 and/or the lower edge electrode 350 may be connected to an RF power source.

The method for generating the plasma P by the substrate processing apparatus 1000 described in the above-described example may be an inductive coupled plasma (ICP) method. In addition, the method for generating the plasma P by the substrate processing apparatus 1000 may be a capacitor couple plasma (CCP) method. In addition, the substrate processing apparatus 1000 may generate the plasma P by using both the ICP method and the CCP method, or using a method selected from the ICP method and the CCP method. Also, the substrate processing apparatus 1000 may generate the plasma P by using a remote plasma method.

The above detailed description is illustrative of the present disclosure. In addition, the above description shows and describes preferred embodiments of the present disclosure, and the present disclosure may be used in various other combinations, modifications, and environments. In other words, changes or modifications may be made within the scope of the inventive concept disclosed herein, the scope equivalent to the written disclosure, and/or the scope of skill or knowledge in the art. The above-described embodiments describe the best state for implementing the technical idea of the present disclosure, and various changes required in specific application fields and uses of the present disclosure may be made. Accordingly, the detailed description of the present disclosure is not intended to limit the present disclosure to the disclosed embodiments. Also, the appended claims should be construed as including other embodiments.

The invention claimed is:

1. A substrate processing apparatus comprising:

a chuck supporting a substrate;

a dielectric plate provided to face an upper surface of the substrate supported on the chuck;

a gas supply unit configured to supply a process gas to an edge region of the substrate supported on the chuck; and an edge electrode provided to surround the substrate supported on the chuck when viewed from above and to generate plasma from the process gas, wherein the edge electrode has a ring shape and a groove recessed in a direction from an inner periphery of the edge electrode to an outer periphery of the edge electrode when viewed from above is formed in the edge electrode; and a gap measurement sensor comprising a light radiator configured to radiate light and a light receiver configured to receive the light and measure a gap between the dielectric plate and the substrate supported on the chuck, based on the received light, wherein an opening is formed between an upper portion and a lower portion of the edge electrode, and is arranged to face the light radiator and the light receiver such that the light radiated by the gap measurement sensor passes through the opening in the edge electrode to measure the gap.

2. The substrate processing apparatus of claim 1, wherein the groove is formed at a position facing a side of the substrate while the substrate supported on the chuck is processed by the plasma.

3. The substrate processing apparatus of claim 2, wherein the groove is formed in a ring shape to surround a side of the substrate supported on the chuck.

4. The substrate processing apparatus of claim 1, further comprising:

a base installed above the substrate supported on the chuck and fixing a position of the edge electrode.

5. The substrate processing apparatus of claim 1, further comprising an insulating ring provided to surround the chuck, wherein the edge electrode is provided to surround the insulating ring.

6. The substrate processing apparatus of claim 1, wherein the edge electrode is grounded.

7. The substrate processing apparatus of claim 1, wherein the gas supply unit comprises:

a first gas supply unit configured to supply an inert gas to a central region of the substrate supported on the chuck; and a second gas supply unit configured to supply the process gas to the edge region of the substrate supported on the chuck.

8. The substrate processing apparatus of claim 1, further comprising a power member configured to apply radio frequency (RF) power to the chuck.

9. The substrate processing apparatus of claim 1, wherein at least one of the dielectric plate and the chuck is configured to be movable in a vertical direction.

10. The substrate processing apparatus of claim 1, wherein the opening is in communication with the groove.

11. A substrate processing apparatus comprising:

a housing having a processing space;

a support unit supporting a substrate in the processing space;

a dielectric plate disposed above the support unit and facing an upper surface of the substrate supported on the support unit;

an upper edge electrode provided to surround the dielectric plate when viewed from above;

a gas supply unit configured to supply a process gas to a space between the upper edge electrode and the dielectric plate;

a power member configured to generate plasma from the process gas; and a gap measurement sensor comprising a light radiator configured to radiate light and a light receiver configured to receive the light and measure a gap between the dielectric plate and the substrate supported on the support unit, based on the received light, wherein a groove recessed in a direction from an inner periphery of the upper edge electrode to an outer periphery of the upper edge electrode when viewed from above is formed in the upper edge electrode, and wherein an opening is formed between an upper portion and a lower portion of the edge electrode, and is arranged to face the light radiator and the light receiver such that the light radiated by the gap measurement sensor passes through the opening in the edge electrode to measure the gap.

12. The substrate processing apparatus of claim 11, wherein the groove is formed at a position facing a side of the substrate supported on the support unit while the substrate is processed by the plasma.

13. The substrate processing apparatus of claim 12, wherein the groove is formed in a ring shape to surround a side of the substrate supported on the support unit.

14. The substrate processing apparatus of claim 11, wherein the upper edge electrode is installed such that a position thereof is fixed, wherein the support unit comprises:

a chuck supporting the substrate; and a driving member vertically moving the chuck.

15. The substrate processing apparatus of claim 14, wherein the support unit further comprises the power member configured to apply RF power to the chuck.

16. The substrate processing apparatus of claim 11, wherein the opening is in communication with the groove.

\* \* \* \* \*